(12) United States Patent
Inoue et al.

(10) Patent No.: US 7,157,370 B2
(45) Date of Patent: Jan. 2, 2007

(54) SEMICONDUCTOR DEVICE AND METHOD FOR MANUFACTURING THE SAME

(75) Inventors: Hiroaki Inoue, Tokyo (JP); Akira Susaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/893,244

(22) Filed: Jul. 19, 2004

(65) Prior Publication Data

US 2005/0029669 A1 Feb. 10, 2005

(30) Foreign Application Priority Data

Jul. 17, 2003 (JP) ............................. 2003-198663

(51) Int. Cl.
*H01L 21/4763* (2006.01)

(52) U.S. Cl. ............... 438/637; 438/673; 438/675; 257/758; 257/760; 257/762

(58) Field of Classification Search .............. 438/637, 438/673, 675; 257/758, 760, 762
See application file for complete search history.

(56) References Cited

U.S. PATENT DOCUMENTS

| 5,674,787 | A |   | 10/1997 | Zhao et al. |         |
|-----------|---|---|---------|-------------|---------|
| 5,695,810 | A |   | 12/1997 | Dubin et al.|         |
| 6,114,243 | A |   | 9/2000  | Gupta et al.|         |
| 6,815,329 | B1| * | 11/2004 | Babich et al. | 438/619 |
| 6,841,844 | B1| * | 1/2005  | Hsu et al.  | 257/522 |
| 6,893,955 | B1| * | 5/2005  | Lopatin et al. | 438/627 |
| 6,894,364 | B1| * | 5/2005  | Hao et al.  | 257/532 |
| 6,924,240 | B1| * | 8/2005  | Nobutoki et al. | 438/783 |
| 6,949,832 | B1| * | 9/2005  | Kunishima et al. | 257/762 |

* cited by examiner

*Primary Examiner*—Fernando L. Toledo
(74) *Attorney, Agent, or Firm*—Wenderoth, Lind & Ponack, L.L.P.

(57) ABSTRACT

A semiconductor device includes a highly reliable multi-level interconnect structure having a low effective dielectric constant and which can be easily manufactured with a relatively inexpensive process, and a method for manufacturing the semiconductor device. The semiconductor device includes a lower-level interconnect and an upper-level interconnect, each surrounded by a barrier layer, and a via plug surrounded by a barrier layer and electrically connecting the lower-level interconnect and the upper-level interconnect.

17 Claims, 11 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, and more particularly to a semiconductor device having a multi-level interconnect structure in which lower-level interconnects (first-level interconnects) and upper-level interconnects (second-level interconnects) are electrically connected by via plugs embedded in via holes, and a method for manufacturing the semiconductor device.

2. Description of the Related Art

A process which comprises embedding a metal (electrical conductor) in interconnect trenches and via holes (so-called dual damascene process) is coming into practical use as a process for forming multi-level interconnects in manufacturing of a semiconductor device. According to this process, aluminum, or more recently a metal such as copper, silver, or the like, is embedded in interconnect trenches and via holes which have previously been formed in an interlevel dielectric layer formed on a semiconductor substrate, and then extra metal is removed by chemical-mechanical polishing (CMP) to flatten a surface of the substrate.

With respect to interconnects formed by such a process, for example, copper interconnects formed by using copper as an interconnect material, and surfaces of copper interconnects are exposed after performing a flattening process. In order to prevent thermal diffusion of the interconnects (copper), or to prevent oxidation of the interconnects (copper), for example, when superimposing thereon an insulating film (oxide film) in an oxidizing atmosphere to manufacture a semiconductor device having a multi-level interconnect structure, it is generally practiced to form a barrier layer (protective layer for interconnects) of SiN, SiC or the like not only on an interconnect region where the interconnects are exposed on a surface, but on an entire surface of the substrate.

FIG. 11 shows a general construction of a conventional multi-level interconnect structure of copper interconnects which are formed by using a dual damascene process. As shown in FIG. 11, interconnect trenches 14 are formed, for example, by performing a lithography/etching technique, in an insulating film (interlevel dielectric layer) 12 of, for example, SiO$_2$ or a low-k material deposited on an insulating film 11 formed in a surface of a semiconductor substrate 10 having semiconductor devices formed therein. A barrier layer (diffusion preventing layer) 16 of TaN or the like is formed on the insulating film 12. Copper is embedded in the interconnect trenches 14 to form first-level copper interconnects (lower-level interconnects) 18, and a barrier layer (protective layer for interconnects) 20 of SiN or the like is formed on an entire surface, including exposed surfaces of the copper interconnects 18, to thereby form a first-level interconnect structure (lower-level interconnect structure).

The copper interconnects 18 are formed by performing copper plating to fill the interconnect trenches 14 with copper and deposit copper on the insulating film 12, followed by chemical-mechanical polishing (CMP) to remove extra copper and extra portions of the barrier layer on the insulating film 12 so as to make a surface of copper filling the interconnect trenches 14 substantially flush with a surface of the insulating film 12.

On an upper surface of the semiconductor substrate 10, having the first-level interconnect structure, is deposited an insulating film (interlevel dielectric layer) 22 of, for example, SiO$_2$ or a low-k material. Via holes 24, reaching the first-level interconnects 18, and interconnect trenches 26 which are continuous with the via holes 24, are formed, for example, by performing a lithography/etching technique, in the insulating film 22. A barrier layer (diffusion preventing layer) 30 of TiN or the like is formed on the insulating film 22. Copper is embedded in the via holes 24 and the interconnect trenches 26 to form second-level copper interconnects (upper-level interconnects) 32 and via plugs 34 which electrically connect the copper interconnects 32 with the first-level copper interconnects 18. Then, a barrier layer (protective layer for interconnects) 36 of SiN or the like is formed on an entire surface, including exposed surfaces of the copper interconnects 32, to thereby form a second-level interconnect structure (upper-level interconnect structure).

As with the copper interconnects 18, the copper interconnects 32 are formed by performing copper plating, followed by chemical-mechanical polishing (CMP) to remove extra portions of a metal film for flattening of a surface.

It is also generally practiced to heat-treat (anneal) copper interconnects (copper plated film), prior to polishing away extra portions of the metal film by CMP, to recrystallize the copper interconnects.

With a conventional multi-level interconnect structure formed by using a dual damascene process, however, it is generally difficult to embed an interconnect material, such as copper, in via holes and interconnect trenches uniformly without mottles by, for example, electroplating. As shown in FIG. 11, voids V can be formed in the holes and trenches, which lowers a reliability of the interconnects and increases a resistance of the interconnects. It is thus difficult to establish a practical process. Further, embedding of interconnect material is generally performed by electroplating and, in this case, a copper seed layer is formed on a surface of a barrier layer in advance of the electroplating. Such a copper seed layer is generally formed by PVD or CVP, which employs a costly vacuum technology, that results in an increased cost. Further, as interconnects become finer, formation of a thin film seed layer having a uniform thickness is generally becoming difficult.

Further, when the barrier layer 20 of SiN or the like, as a protective film for interconnects, is formed on the entire surface of the substrate, dielectric constant k of the barrier layer 20 is generally higher than dielectric constant k of common interlevel dielectric layers 12, 22. A difference in this dielectric constant is marked especially when a low-k material is used for the interlevel dielectric layers 12, 22, and the dielectric constant of the interlevel dielectric layers as a whole is increased, which includes interconnect delay. Even when a low-resistance material, such as copper or silver, is employed as an interconnect material, enhancement of performance of the semiconductor device will be impeded.

Furthermore, stress in interconnects and via plugs embedded in interconnect trenches and via holes cannot be reduced. This can cause electromigration (EM) or stress migration (SM), leading to lowering of reliability of the interconnects.

SUMMARY OF THE INVENTION

The present invention has been made in view of the above situation in the related art. It is therefore an object of the present invention to provide a semiconductor device which has a highly reliable multi-level interconnect structure having a low effective dielectric constant and which can be easily manufactured with a relatively inexpensive process, and a method for manufacturing the semiconductor device.

In order to achieve this object, the present invention provides a semiconductor device comprising: a lower-level interconnect and an upper-level interconnect, each surrounded by a barrier layer; and a via plug surrounded by a barrier layer and electrically connecting the lower-level interconnect and the upper-level interconnect; wherein the lower-level interconnect, the upper-level interconnect and the via plug are each embedded in an insulating film.

According to the semiconductor device, the lower-level interconnect, the upper-level interconnect and the via plug are each surrounded and protected by a barrier layer. Further, the semiconductor device eliminates a need to provide in an insulating film a barrier layer of SiN or the like which extends over substantially an entire area of the insulating film. This can lower an effective dielectric constant of the insulating film as a whole. This effect is marked especially when a low-k material is used for the insulating film.

In a preferred embodiment of the present invention, the interconnects and the via plug are composed of Cu, a Cu alloy, Ag, an Ag alloy, Au or an Au alloy. Use of such a metal or metal alloy as an interconnect material and as a via material enables speeding up and densification of the semiconductor device.

In a preferred embodiment of the present invention, the barrier layer is composed of Co, a Co alloy, Ni, a Ni alloy, Ti, a Ti alloy, Ta or a Ta alloy, or a nitride thereof. Examples of the Co alloy include CoP, CoB, CoWP and CoWB. Examples of the Ni alloy include NiP, NiB, NiWP and NiWB.

In a preferred embodiment of the present invention, the barrier layer covering a bottom surface of each of the lower-level interconnect and the upper-level interconnect is formed on a liner layer composed of at least one of Pd, Ag, Au, Pt, Co, Ni and Sn, or an alloy thereof.

The present invention also provides a method for manufacturing a semiconductor device, comprising: forming a lower-level interconnect surrounded by a first barrier layer on a surface of an insulating film such that the lower-level interconnect extends beyond the surface of the insulating film; forming a first interlevel dielectric layer on the surface of the insulating film such that a surface of the first barrier layer is exposed; forming a via plug surrounded by a second barrier layer on a surface of the first barrier layer such that the via plug extends beyond a surface of the first interlevel dielectric layer so that the via plug is electrically connected to the lower-level interconnect; forming a second interlevel dielectric layer on the surface of the first interlevel dielectric layer and the first barrier layer such that a surface of the via plug is exposed; and forming an upper-level interconnect surrounded by a barrier layer on a surface of the second interlevel dielectric layer such that the upper-level interconnect extends beyond the surface of the second interlevel dielectric layer so that the upper-level interconnect is electrically connected to the via plug.

The above method makes it possible to manufacture a semiconductor device having a multi-level interconnect structure with a relatively inexpensive process, without using a dual damascene process, and with an increased throughput.

In a preferred embodiment of the present invention, the first interlevel dielectric layer and the second interlevel dielectric layer are each formed by applying an insulating film material and then curing this insulating material.

By curing the interlevel dielectric layer, i.e. hardening it by heating, a strength of the interlevel dielectric layer can be enhanced. Further, the interlevel dielectric layer is made porous, i.e. pores are formed within the layer, whereby the dielectric constant k can be lowered. The curing may be performed, for example, by exposing the substrate to an $N_2$ atmosphere at 200 to 500° C. for 0.5 to 2 hours.

The surface of the first interlevel dielectric layer after curing and the surface of the second interlevel dielectric layer after curing may each be polished to remove extra portions of the interlevel dielectric layer so as to flatten a surface. This flattening may be performed by CMP.

The interconnects and the via plug may preferably be composed of Cu, a Cu alloy, Ag, an Ag alloy, Au or an Au alloy.

The barrier layer may preferably be composed of Co, a Co alloy, Ni, a Ni alloy, Ti, a Ti alloy, Ta or a Ta alloy, or a nitride thereof.

In a preferred embodiment of the present invention, the lower-level interconnect surrounded by the barrier layer and the upper-level interconnect surrounded by the barrier layer are each formed by a process, comprising: forming a liner layer on the surface of the insulating film; forming a barrier layer on a surface of the liner layer; forming an interconnect pattern with a resist on a surface of the barrier layer; embedding an interconnect material in the interconnect pattern to form an interconnect composed of the interconnect material; removing the resist on the barrier layer, extra portions of the barrier layer and extra portions of the liner layer; and forming a barrier layer selectively on an entire exposed surface of the interconnect.

After embedding of the interconnect material in the interconnect pattern, a surface may be polished to remove extra interconnect material so as to flatten the surface. This flattening may be performed by CMP.

After removal of the resist on the barrier layer, the extra portions of the barrier layer and the extra portions of the liner layer, the interconnect may be heat-treated.

By heat-treating (annealing) the interconnect of e.g. copper to recrystallize the interconnect, a specific resistance ($\rho$) of the interconnect can be lowered. Further, stress in the interconnect can be reduced, whereby stress migration resistance and electromigration resistance can be enhanced. This heat treatment may be performed, for example, by exposing the substrate to an $N_2$ atmosphere, an $N_2+H_2$ atmosphere, an Ar atmosphere, a vacuum atmosphere or a reducing atmosphere at 50 to 1000° C. for not more than 5 hours.

The liner layer may preferably be composed of at least one of Pd, Ag, Au, Pt, Co, Ni and Sn, or an alloy thereof.

The liner layer functions as a seed layer upon electroplating and as a catalyst layer upon electroless plating, and may be formed, for example, by PVD, CVD, ALD or a wet processing.

The embedding of the interconnect material may be performed selectively in a bottom-up manner by electroplating or electroless plating. By performing the embedding of the interconnect material by bottom-up plating, i.e. allowing a plating film to grow from a bottom of the interconnect pattern, formation of voids in the interconnect can be prevented.

The removal of the extra portions of the barrier layer and the extra portions of the liner layer may be performed by selective etching utilizing the interconnect as a mask.

Selective formation of the barrier layer on the entire exposed surface of the interconnect may be performed by electroless plating utilizing the interconnect as a catalyst.

The interconnect can be protected by the barrier layer formed on the entire exposed surface of the interconnect. Further, selective formation of this barrier metal on the entire exposed surface of the interconnect can eliminate a need to provide a barrier layer of SiN or the like extending over substantially an entire area of the insulating film, thereby lowering an effective dielectric constant of the insulating film.

In a preferred embodiment of the present invention, the via plug surrounded by the barrier layer is formed by a process comprising: forming a via pattern with a resist on a surface of the first interlevel dielectric layer and the lower-level interconnect; embedding a metal in the via pattern to form a via plug composed of the metal; removing the resist on the first interlevel dielectric layer and on the lower-level interconnect; and forming a barrier layer selectively on an entire exposed surface of the via plug.

After removal of the resist on the first interlevel dielectric layer and on the lower-level interconnect, the via plug may be heat-treated.

By heat-treating (annealing) the via plug of e.g. copper to recrystallize the via plug, a specific resistance (p) of the via plug can be lowered. Further, stress in the via plug can be reduced, whereby stress migration resistance and electromigration resistance can be enhanced. This heat treatment may be performed in the same manner as described above with respect to the interconnect.

Embedding of the metal may be performed selectively in a bottom-up manner by electroless plating. By performing the embedding of the via plug by bottom-up plating, i.e. allowing a plating film to grow from a bottom of the via pattern, formation of voids in the via plug can be prevented.

Selective formation of the barrier layer on the entire exposed surface of the via plug may be performed by electroless plating utilizing the via plug as a catalyst.

By covering the via plug with the barrier layer formed selectively on the entire exposed surface of the via plug, it becomes possible to protect the via plug without increasing an effective dielectric constant of the insulating film.

DETAILED DESCRIPTION OF THE PREFERRED EMBODIMENTS

Preferred embodiments of the present invention will now be described in detail with reference to the drawings. Though the following description illustrates a case of using copper as an interconnect material and as a via material, it is of course possible to use a metal other than copper.

Figure 1:
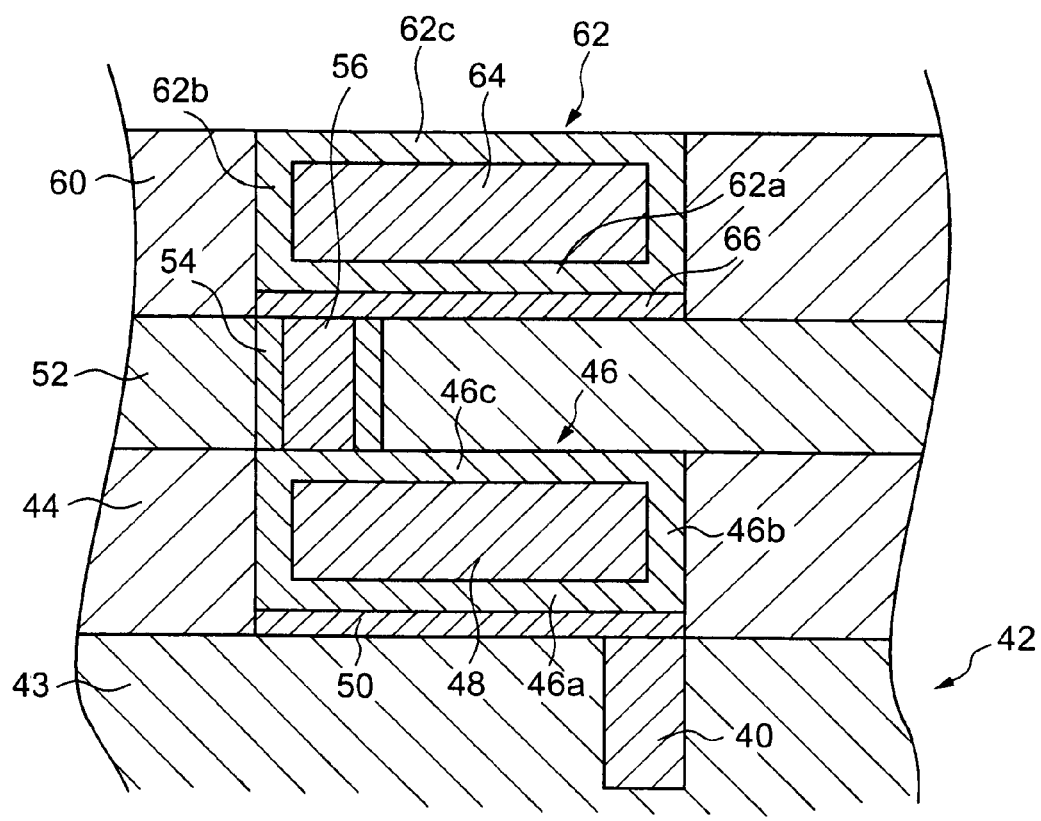
FIG. 1 is a cross-sectional view of a semiconductor device having a multi-level interconnect structure according to an embodiment of the present invention.

FIG. 1 shows a cross-sectional structure of a semiconductor device, having a two-level embedded interconnect structure, according to an embodiment of the present invention. As shown in FIG. 1, on an insulating film 43 of a semiconductor substrate 42 having plugs 40 of, for example, W (tungsten) is deposited an insulating film (first interlevel dielectric layer) 44 of, for example, $SiO_2$ or a low-k material. A lower-level interconnect (first-level interconnect) 48 of copper, surrounded by a barrier layer 46, is positioned on a liner layer 50 and embedded in the first interlevel dielectric layer 44. Specifically, the lower-level interconnect 48 is entirely surrounded by the barrier layer 46 consisting of a lower layer 46a, a side layer 46b and an upper layer 46c, and the lower layer 46a is formed on the liner layer 50. A first-level interconnect structure (lower-level interconnect structure) is thus constructed.

The liner layer 50 functions as a catalyst layer when forming the lower layer 46a of the barrier layer 46 surrounding the lower-level interconnect 48 by electroless plating, or as a seed layer when forming the lower layer 46a by electroplating. The liner layer 50 is composed of, for example, at least one of Pd, Ag, Au, Pt, Co, Ni and Sn, or an alloy thereof, and is composed of Co according to this embodiment. The barrier layer 46 functions as a protective layer for protecting the lower-level interconnect 48 and/or as a diffusion preventing layer for preventing diffusion of the interconnect (copper) 48. The barrier layer 46 is composed of, for example, Co, a Co alloy, Ni, a Ni alloy, Ti, a Ti alloy, Ta or a Ta alloy, or a nitride thereof, and is composed of a COWB alloy according to this embodiment. This holds also for the below-described liner layer and barrier layers.

An insulating film (second interlevel dielectric layer) 52 of, for example, a low-k material is deposited on the first interlevel dielectric layer 44, and a columnar via plug 56 of copper, which is surrounded by a barrier layer 54 and whose lower end is in electrical connection with the lower-level interconnect 48, is embedded in the second interlevel dielectric layer 52.

An insulating film (third interlevel dielectric layer) 60 of, for example, a low-k material is deposited on the second interlevel dielectric layer 52, and an upper-level interconnect (second-level interconnect) 64 of copper, surrounded by a barrier layer 62, which is positioned on a liner layer 66 and is in electrical connection with the via plug 56, is embedded in the third interlevel dielectric layer 60. Specifically, the upper-level interconnect 64 is entirely surrounded by the barrier layer 62 consisting of a lower layer 62a, a side layer 62b and an upper layer 62c, and the lower layer 62a is formed on the liner layer 66. A second-level interconnect structure (upper-level interconnect structure), having the upper-level interconnect 64 which is electrically connected by the via plug 56 to the lower-level interconnect 48 of the first-level interconnect structure, is thus constructed.

The lower-level interconnect 48, the upper-level interconnect 64 and the via plug 56 are thus surrounded and protected by the barrier layers 46, 54, 62 which are composed of, for example, a COWB alloy and function as protective layers and/or copper diffusion preventing layers. This can eliminate a need to provide within the insulating film a barrier layer of SiN or the like which extends over substantially an entire area of the insulating film, thereby lowering an effective dielectric constant of the insulating film. An effect of lowering the dielectric constant is marked especially when a low-k material is used for the insulating film.

Next, an example of manufacturing a semiconductor device as shown in FIG. 1 will now be described in sequence of process steps by referring to FIGS. 2A through 10.

Figure 2A:
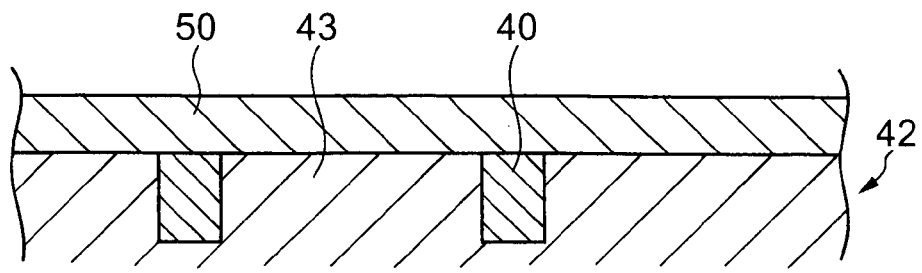
FIGS. 2A through 2C are cross-sectional diagrams illustrating a manufacturing process of the semiconductor device shown in FIG. 1, showing initial process steps up to formation of an interconnect pattern.

First, as shown in FIG. 2A, a semiconductor substrate 42 is provided which has plugs 40 of tungsten (W) and an insulating film 43 which has been flattened, according to necessity, by CMP or the like. A liner layer 50 of, for example, cobalt (Co) is formed (deposited), for example, by sputtering (PVD), on an entire surface of the semiconductor substrate 42. The liner layer 50 functions as a catalyst layer when forming below-described barrier layer 70 by electroless plating, or functions as a seed layer when forming the barrier layer 70 by electroplating. The liner layer 50 may also be formed by CVD, ALD (Atomic Layer Deposition) or a wet processing, besides PVD, or a combination thereof.

When forming the liner layer 50 by PVD, CVD or ALD, a film thickness is made to be, for example, not more than 100 μm. When forming the liner layer 50 by a wet processing, the layer may be formed as discontinuous catalyst-supported layers.

Figure 2B:
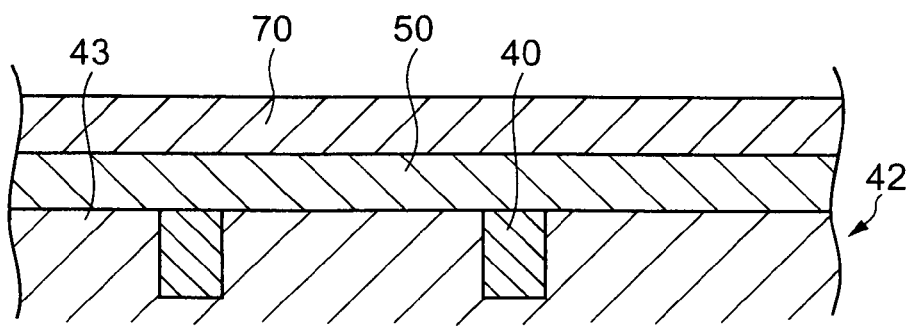

Next, as shown in FIG. 2B, a barrier layer 70 of, for example, a CoWB alloy is formed on an entire surface of the liner layer 50 of Co by electroless plating utilizing the liner layer as a catalyst. The barrier layer 70 may also be formed by electroplating utilizing the liner layer 50 of Co as a seed layer. It is also possible to form a liner layer of, for example, an Ni alloy or a Co alloy by PVD, CVD or ALD.

Figure 2C:
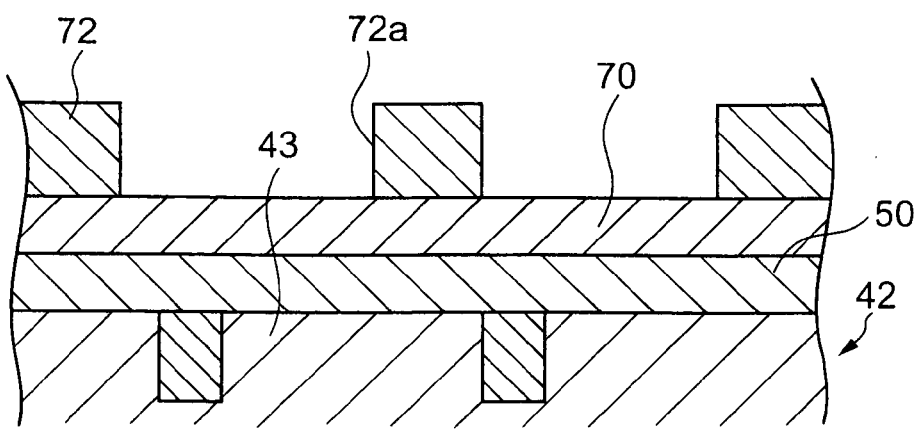

Next, as shown in FIG. 2C, an interconnect pattern having openings (trenches) 72a at predetermined positions is formed, for example, by using a resist 72. The interconnect pattern may be formed by a photoresist pattern formation process comprising steps of resist coating, light exposure, EB exposure and resist development.

Figure 3A:
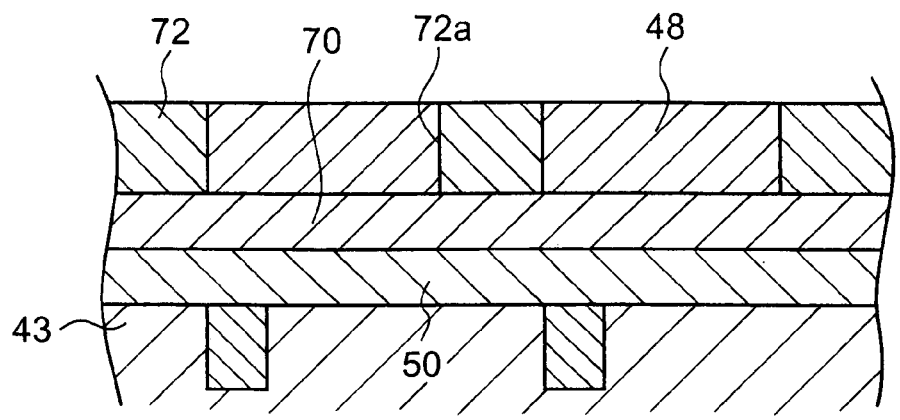
FIGS. 3A through 3C are cross-sectional diagrams illustrating the manufacturing process of the semiconductor device shown in FIG. 1, showing subsequent process steps up to formation of lower-level interconnects.

Next, as shown in FIG. 3A, an interconnect material (copper) is embedded selectively in a bottom-up manner in the trenches 72a surrounded by the resist 72 of the interconnect pattern, for example, by electroless plating utilizing the barrier layer 70 as a catalyst. Thereafter, according to necessity, extra copper is removed by CMP to flatten a surface, thereby forming lower-level interconnects (first-level interconnects) 48. In the electroless plating, dimethylamine borane (DMAB) is used as a reducing agent when the barrier film 70 is a Co alloy or a Ni alloy, while glyoxylic acid (GOA) is used as a reducing agent when the liner layer 50 is Pd, Ag, Au, Pt or Sn. By thus forming the lower-level interconnects 48 by electroless plating in a bottom-up manner, i.e., allowing a plating film to grow from a bottom of the trenches 72a, formation of voids in the lower-level interconnects 48 can be prevented. This bottom-up embedding of the interconnect material may also be performed by electroplating.

Figure 3B:
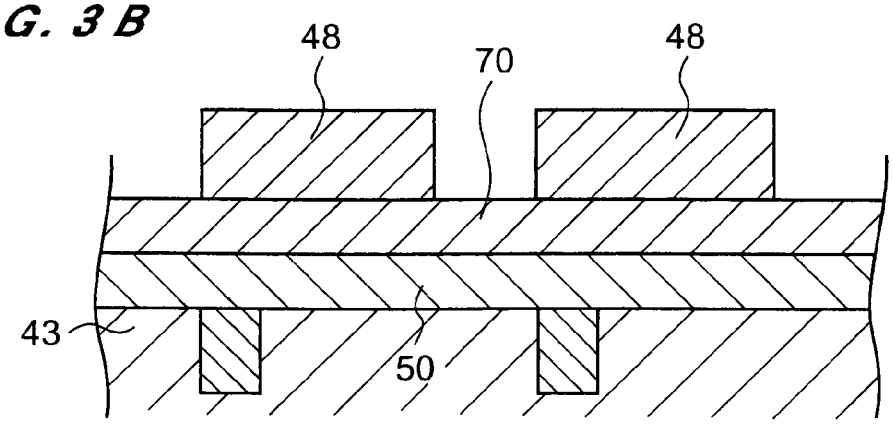
Figure 3C:
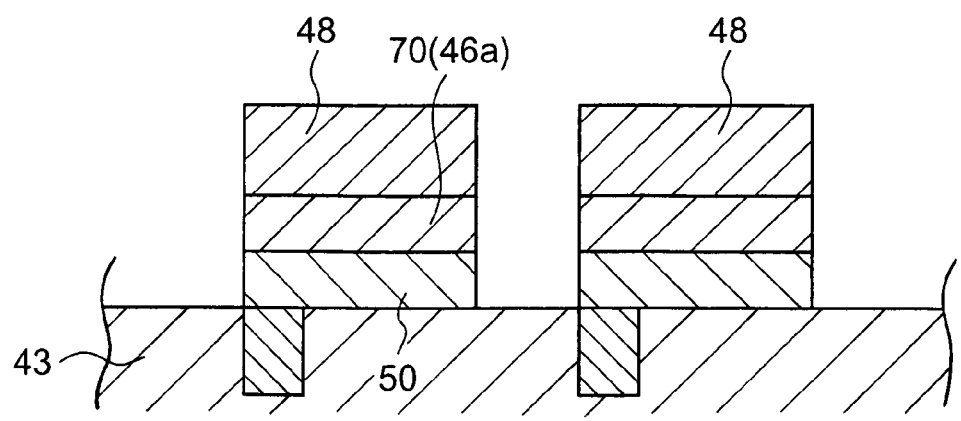

Thereafter, as shown in FIG. 3B, unnecessary resist 72 on the barrier layer 70 is removed. Further, as shown in FIG. 3C, extra portions of the barrier layer 70 and extra portions of the liner layer 50 on the insulating film 43 are removed, for example, by wet etching utilizing the lower-level interconnects 48 as a mask. The barrier layer 70 after this etching constitutes the lower layer 46a shown in FIG. 1.

The lower-level interconnects 48 are then subjected to heat treatment (annealing), for example, in an $N_2+H_2$ atmosphere at 400° C. for 30 minutes to recrystallize the lower-level interconnects 48 of e.g. copper, thereby lowering a specific resistance ($\rho$) of the lower-level interconnects 48. By heat-treating the lower-level interconnects 48 while the lower-level interconnects 48 are thus exposed, stress in the lower-level interconnects 48 can be reduced whereby stress migration resistance and electromigration resistance can be enhanced. Such a stress reduction is not possible with interconnects in a damascene process in which interconnects are in a constrained state. Besides the $N_2+H_2$ atmosphere, the heat treatment (annealing) may be performed in an $N_2$ atmosphere, an Ar atmosphere, a vacuum atmosphere or a reducing atmosphere. The heat treatment may be performed by exposing the interconnects to such an atmosphere at 50 to 1000° C. for not more than 5 hours.

Figure 4A:
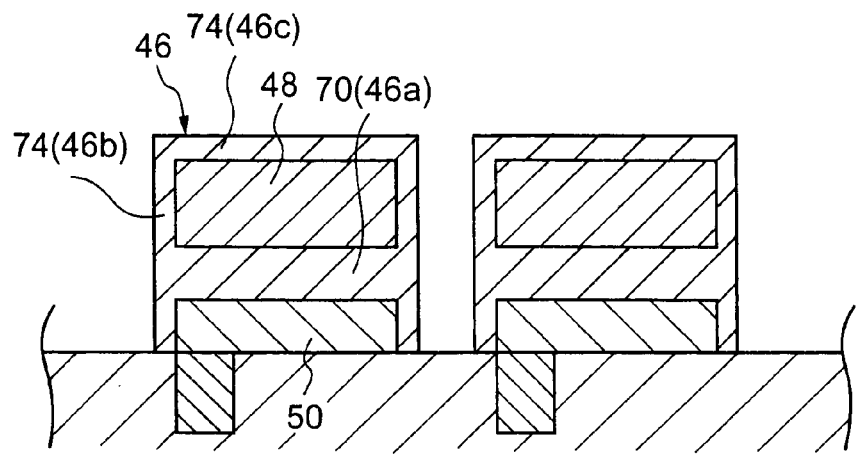
FIGS. 4A through 4C are cross-sectional diagrams illustrating the manufacturing process of the semiconductor device shown in FIG. 1, showing subsequent process steps up to flattening of a surface of a first interlevel dielectric layer.

Next, as shown in FIG. 4A, a barrier layer 74 is formed selectively on entire exposed surfaces of the lower-interconnects 48 by electroless plating utilizing the lower-level interconnects as a catalyst, whereby the lower-level interconnects 48 are entirely surrounded and protected by a barrier layer 46 consisting of the lower layer 46a, comprised of the barrier layer 70, and a side layer 46b and an upper layer 46c, both comprised of the barrier layer 74. By thus selectively forming, by electroless plating, the barrier layer 74 on the entire exposed surfaces of the lower-level interconnects 48, a need to provide a barrier layer extending over substantially an entire area of the insulating film can be eliminated, whereby an effective dielectric constant of the insulating film can be lowered. The barrier layer 74 may also be formed by selective CVD or selective ALD.

In the above annealing of the interconnects (lower-level interconnects 48) of copper, an amorphous C film may be formed on surfaces of annealed copper interconnects. In this case, the amorphous C film can be etched away by performing etching with $H_2SO_4$ as a pre-treatment of electroless plating.

Figure 4B:
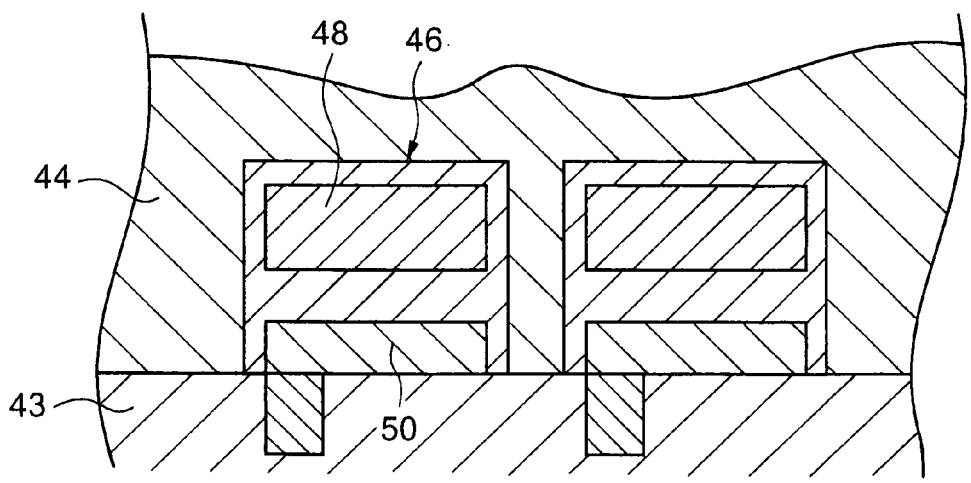
Figure 4C:
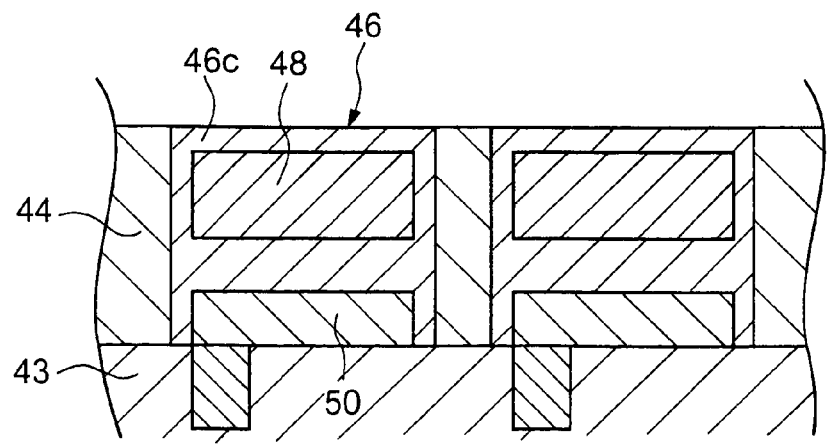

Thereafter, as shown in FIG. 4B, a low-k material is applied onto the surface of the insulating film 43 e.g. by coating (spin coating), and the material is cured, i.e. hardened by heating to thereby form an insulating film (first interlevel dielectric layer) 44 composed of e.g. the low-k material. By curing the low-k material, a strength of the interlevel dielectric layer 44 can be enhanced. Further, the interlevel dielectric layer 44 can be made porous, i.e., pores can be formed within the layer, whereby dielectric constant k can be lowered. The curing is performed, for example, by exposing the substrate to an $N_2$ atmosphere at 200 to 500° C. for 0.5 to 2 hours. Next, as shown in FIG. 4C, a surface of the first interlevel dielectric layer 44 is polished and flattened until the surface becomes flush with a surface of the upper layer 46c, covering upper surfaces of the lower-level interconnects 48, of the barrier layer 46, thereby completing a first-level interconnect structure (lower-level interconnect structure).

Figure 5A:
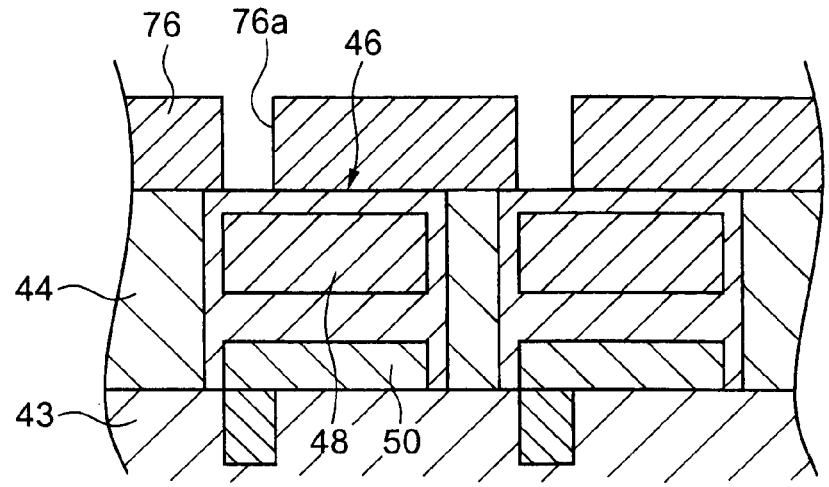
FIGS. 5A through 5C are cross-sectional diagrams illustrating the manufacturing process of the semiconductor device shown in FIG. 1, showing subsequent process steps up to formation of via plugs.
Figure 5B:
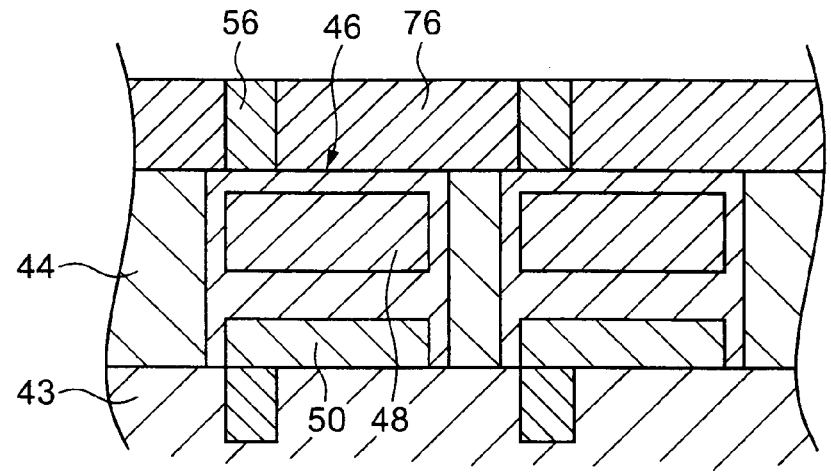

Thereafter, as shown in FIG. 5A and similarly to the above-described interconnect pattern, a via pattern having openings (via holes) 76a at predetermined positions is formed on a surface of the first interlevel dielectric layer 44 and the upper layer 46c, covering the upper surfaces of the lower-level interconnects 48, of the barrier layer 46 by, for example, using a resist 76. Thereafter, as shown in FIG. 5B and similarly to the embedding of interconnects 48, a via material (copper) is embedded selectively in a bottom-up manner in the via holes 76a surrounded by the resist 76 of the via pattern, for example, by electroless plating utilizing the upper layer 46c (of the barrier layer 46) as a catalyst. Thereafter, according to necessity, extra copper is removed by CMP to flatten a surface, thereby forming via plugs 56 of copper.

Figure 5C:
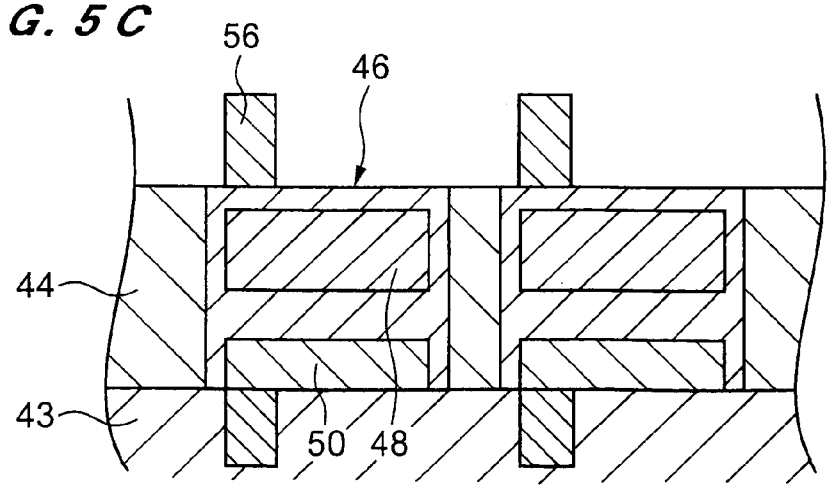

Next, as shown in FIG. 5C, the resist 76 on the surface of the first interlevel dielectric layer 44 and the upper layer 46c of the barrier layer 46 covering the upper surfaces of the lower-level interconnects 48, which is no longer necessary, is removed. The via plugs 56 are then subjected to heat treatment (annealing) in the above-described manner, thereby lowering a specific resistance of copper constituting the via plugs 56 and enhancing stress migration resistance and electromigration resistance.

Figure 6A:
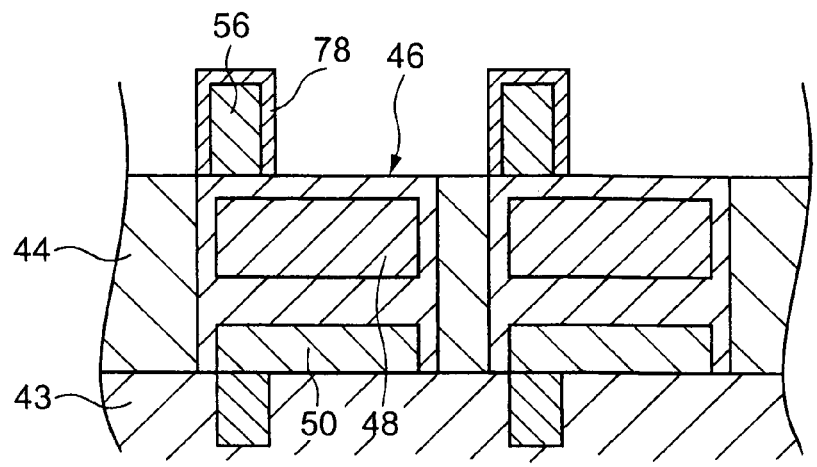
FIGS. 6A through 6C are cross-sectional diagrams illustrating the manufacturing process of the semiconductor device shown in FIG. 1, showing subsequent process steps up to flattening of a surface of a second interlevel dielectric layer.

Next, as shown in FIG. 6A, a barrier layer 78 is selectively formed on entire exposed surfaces of via plugs 56 by electroless plating utilizing the via plugs 56 as a catalyst, whereby the via plugs 56 are surrounded and protected by the barrier layer 78. As described previously, the selective formation by electroless plating of the barrier layer 78 on the entire exposed surfaces of the via plugs 56 can eliminate the need to provide a barrier layer of SiN or the like extending over substantially the entire area of the insulating film, thus lowering the effective dielectric constant of the insulating film.

Figure 6B:
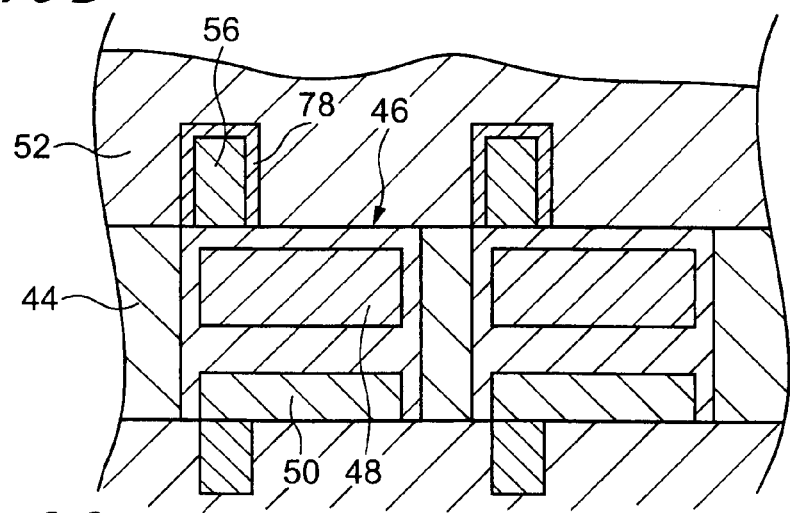
Figure 6C:
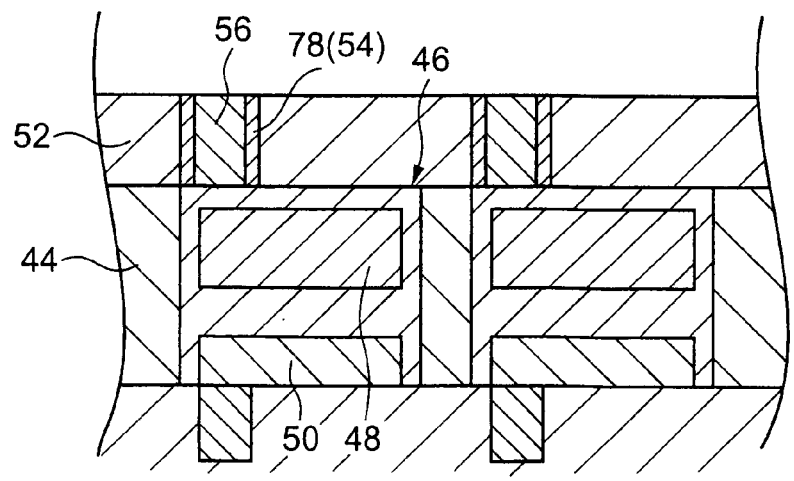

Then, as shown in FIG. 6B, a low-k material is applied onto a surface of the first interlevel dielectric layer and the barrier layer 78 covering the via plugs 56, for example, by coating (spin-coating), and the material is cured, i.e. hardened by heating to thereby form an insulating film (second interlevel dielectric layer) 52 composed of e.g. the low-k material. As described above, by curing the low-k material, a strength of the interlevel dielectric layer 52 can be enhanced, and the interlevel dielectric layer 52 can be made porous, i.e. pores can be formed within the layer, whereby dielectric constant k can be lowered. Next, as shown in FIG. 6C, a surface of the second interlevel dielectric layer 52 is flattened by polishing, including etching back of the barrier layer 78 on the upper surfaces of the via plugs 56, until the surface becomes flush with the upper surfaces of the via plugs 56. The via plugs 56, which are electrically connected to the lower-level interconnects 48 and are surrounded and protected by the barrier layer 78 corresponding to the barrier layer 54 shown in FIG. 1, are thus formed. In some cases, for example, in a case where the barrier layer 78 is hard to etch back, flattening may be effected until the surface of the second interlevel dielectric layer 52 becomes flush with an upper surface of the barrier layer 78.

After completion of formation of the first-level interconnects (lower-level interconnects) and formation of the via plugs electrically connected to the first-level interconnects, second-level interconnects (upper-level interconnects) can be formed in the same manner as in the above-described formation of the first-level interconnects. When forming via plugs on the second-level interconnects, via plugs can be formed in the same manner as described above. The following description illustrates formation of the second-level interconnects (upper-level interconnects).

Figure 7A:
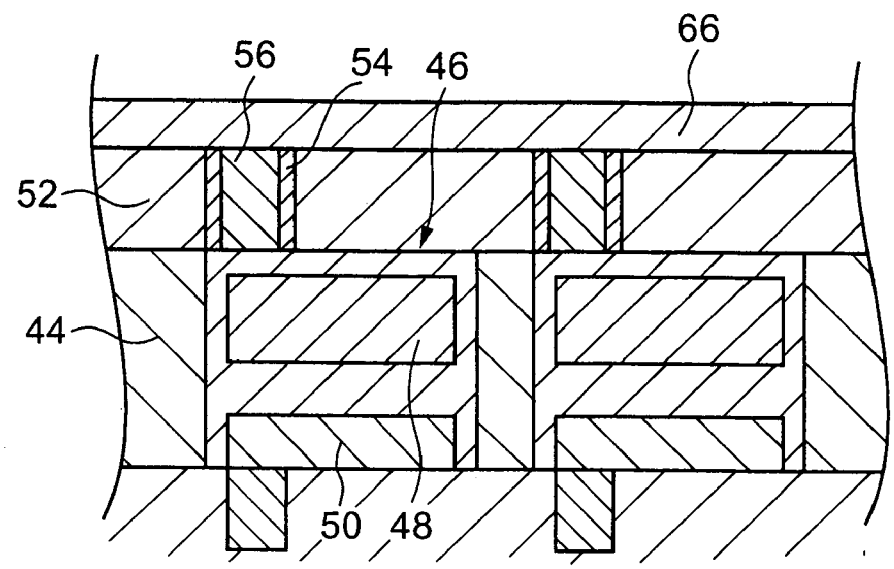
FIGS. 7A and 7B are cross-sectional diagrams illustrating the manufacturing process of the semiconductor device shown in FIG. 1, showing subsequent process steps up to formation of a barrier layer for upper-level interconnects.
Figure 7B:
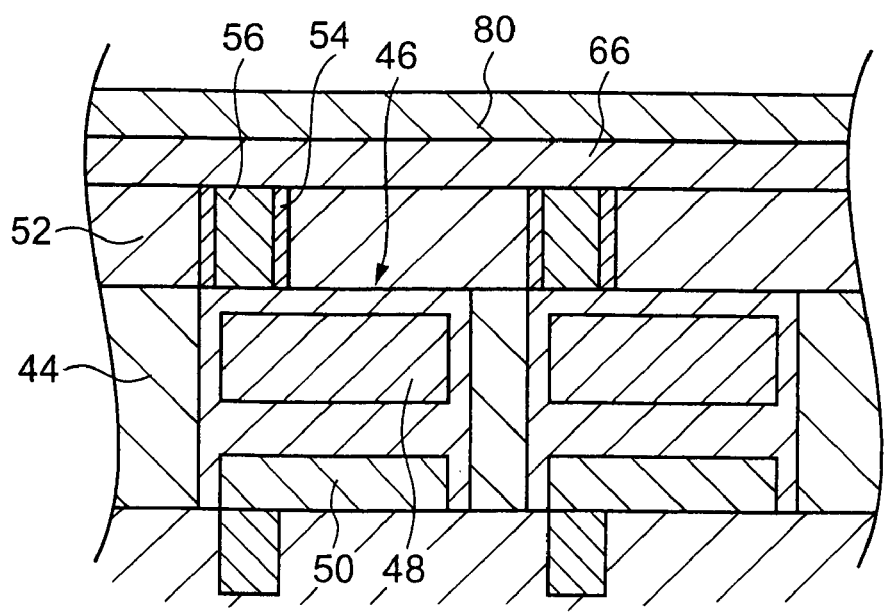
Figure 8A:
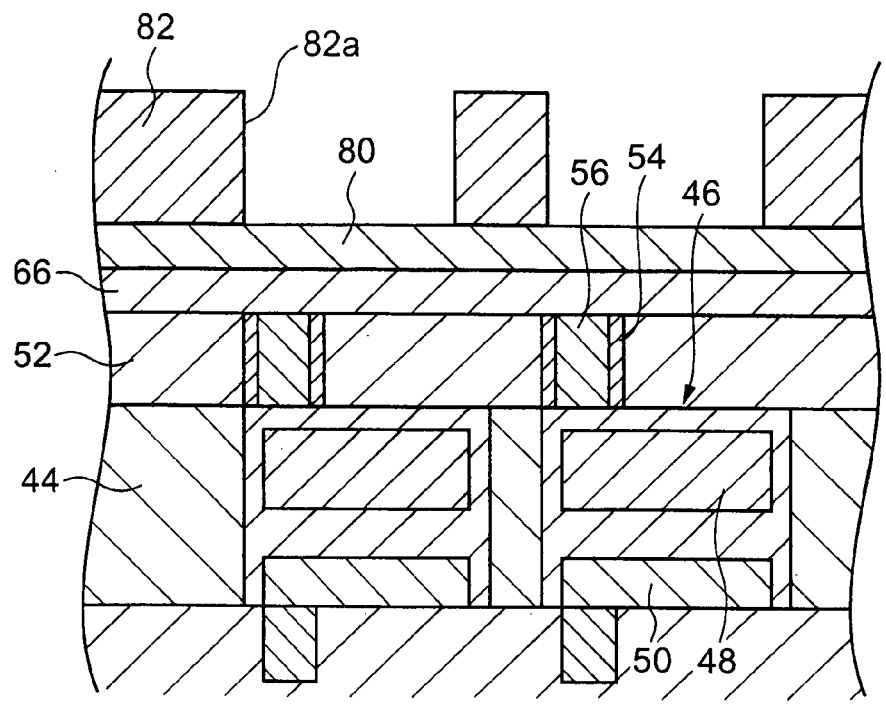
FIGS. 8A and 8B are cross-sectional diagrams illustrating the manufacturing process of the semiconductor device shown in FIG. 1, showing subsequent process steps up to embedding of upper-level interconnects.
Figure 8B:
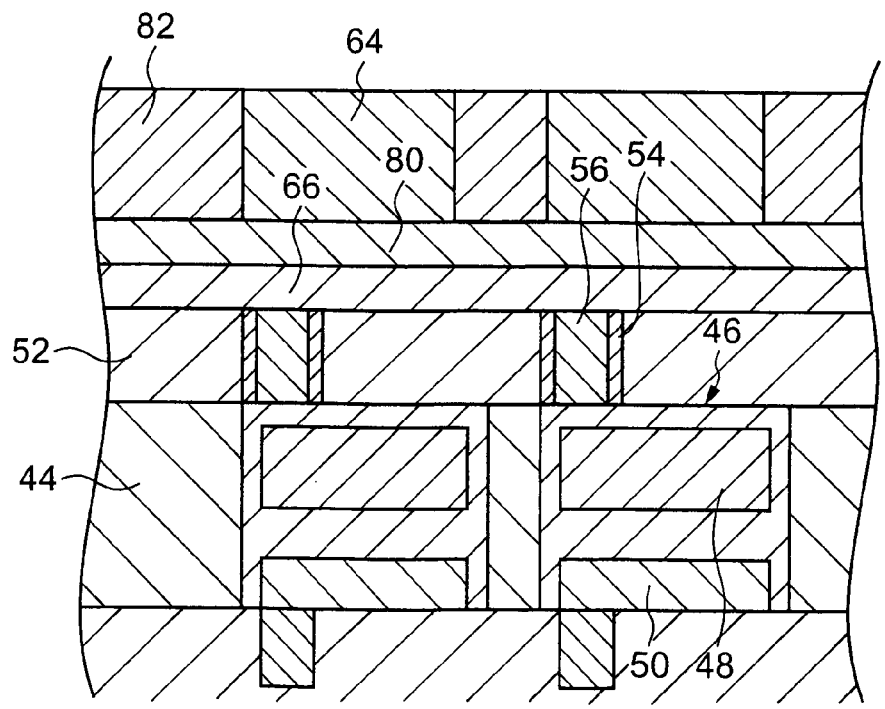

As shown in FIG. 7A, a liner layer 66 of, for example, cobalt (Co) is formed (deposited), for example, by sputtering (PVD), on an entire surface of the second interlevel dielectric layer 52. Then, as shown in FIG. 7B, a barrier layer 80 of, for example, a CoWB alloy is formed on an entire surface of the liner layer 66 by electroless plating utilizing the liner layer as a catalyst. Thereafter, as shown in FIG. 8A, an interconnect pattern having openings (trenches) 82a at predetermined positions is formed on a surface of the barrier layer 80, for example, by using a resist 82. Next, as shown in FIG. 8B, an interconnect material (copper) is embedded selectively in a bottom-up manner in the trenches 82a surrounded by the resist 82 of the interconnect pattern, for example, by electroless plating. Thereafter, according to necessity, extra copper is removed by CMP to flatten a surface, thereby forming upper-level interconnects (second-level interconnects) 64 of copper.

Figure 9A:
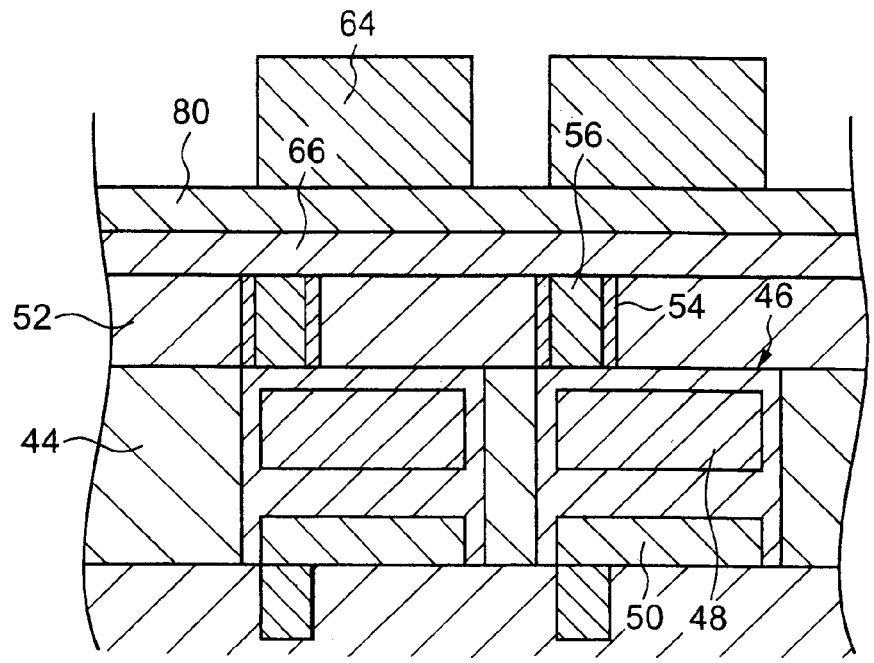
FIGS. 9A and 9B are cross-sectional diagrams illustrating the manufacturing process of the semiconductor device shown in FIG. 1, showing subsequent process steps up to formation of upper-level interconnects.
Figure 9B:
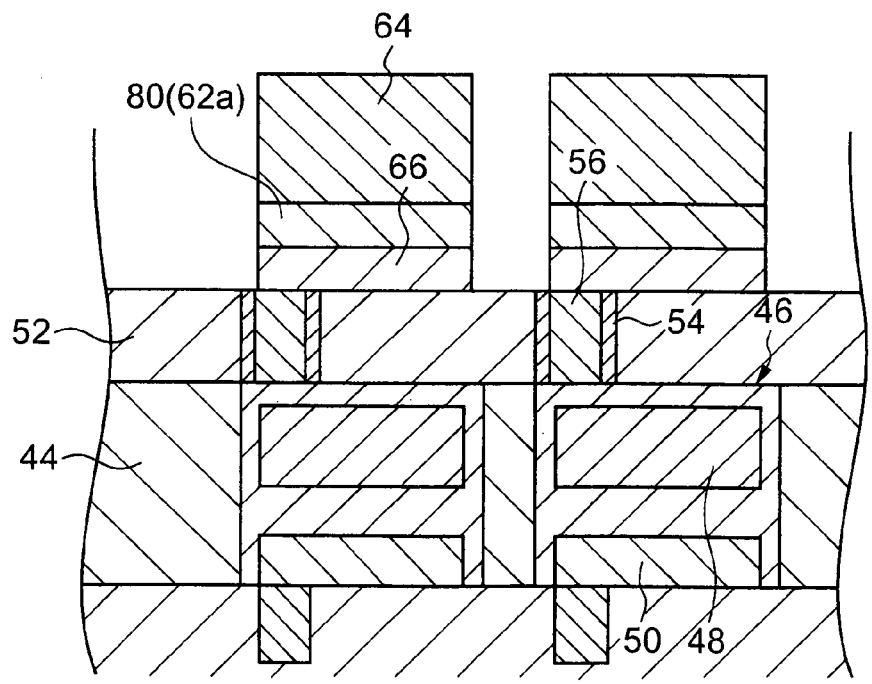

Thereafter, as shown in FIG. 9A, unnecessary resist 82 on the barrier layer 80 is removed, for example, by a wet processing. Further, as shown in FIG. 9B, extra portions of the barrier layer 80 and extra portions of the liner layer 66 on the second interlevel dielectric layer 52 are removed, for example, by wet etching utilizing the upper-level interconnects 64 as a mask. The barrier layer 80 after etching constitutes the lower layer 62a of the barrier layer 62 shown in FIG. 1. The upper-level interconnects 64 are then heat-treated (annealed), for example, in an $N_2+H_2$ atmosphere at 400° C. for 30 minutes to recrystallize the upper-level interconnects 64 of e.g. copper, thereby lowering a specific resistance (ρ) of the upper-level interconnects 64 and, at the same time, enhancing stress migration resistance and electromigration resistance of the upper-level interconnects 64.

Figure 10:
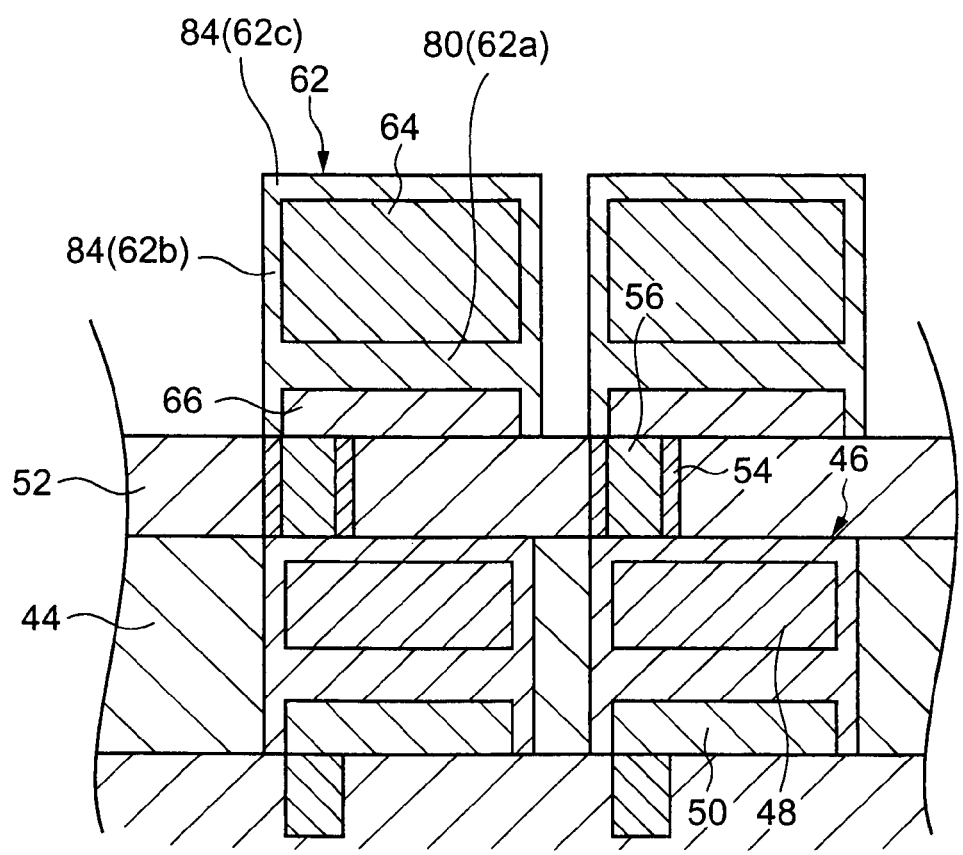
FIG. 10 is a cross-sectional diagram illustrating the manufacturing process of the semiconductor device shown in FIG. 1, showing subsequent process step of forming a barrier layer on an entire exposed surface of upper-level interconnects.
Figure 11:
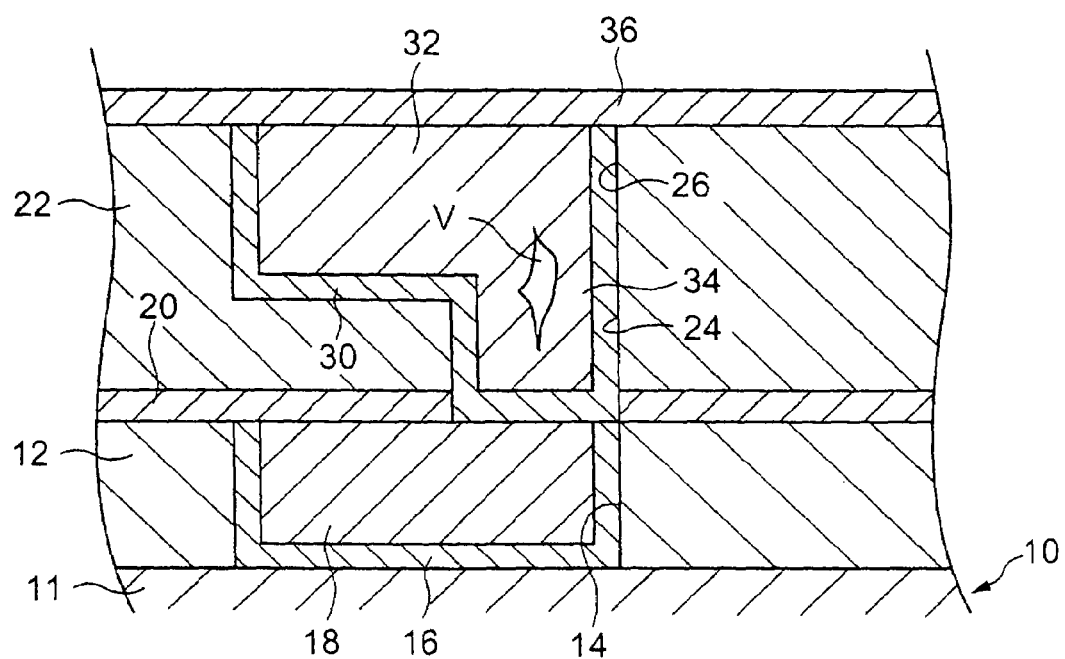
FIG. 11 is a cross-sectional view of a conventional semiconductor device having a multi-level interconnect structure.

Thereafter, as shown in FIG. 10, a barrier layer 84 is formed by electroless plating selectively on entire exposed surfaces of the upper-level interconnects 64, whereby the upper-level interconnects 64 are entirely surrounded and protected by a barrier layer 62 consisting of the lower layer 62a, comprised of the barrier layer 80, and a side layer 62b and an upper layer 62c, both comprised of the barrier layer 84. Thereafter, though not shown diagrammatically, a low-k material is applied onto the surface of the second interlevel dielectric layer 52, for example, by coating (spin coating), and the material is cured, i.e. hardened by heating to thereby form an insulating film (third interlevel dielectric layer) 60 (see FIG. 1) composed of e.g. the low-k material. A surface of the third interlevel dielectric layer 60 is polished and flattened until the surface becomes flush with a surface of the upper layer 62c of the barrier layer 62 covering upper surfaces of the upper-level interconnects 64, thereby completing a second-level interconnect structure (upper-level interconnect structure) as shown in FIG. 1.

EXPERIMENTAL EXAMPLE

A description will now be given of an experimental example in which a semiconductor device having a multi-level interconnect structure as shown in FIG. 1 was actually manufactured by the process shown in FIGS. 2 to 10.

First, a 5 nm-thick liner layer 50 of Co was formed by sputtering on a surface of insulating film 43, after CMP, of semiconductor substrate 42 having plugs 40 shown in FIG.

2A. Thereafter, as shown in FIG. 2B, a 20 nm-thick barrier layer 70 of a COWB alloy was formed on the liner layer (Co layer) 50 by electroless plating utilizing the liner layer 50 as a catalyst.

Next, as shown in FIG. 2C, openings (trenches) 72a e.g. having a width of 50 nm, a depth of 100 nm and an AR (aspect ratio) of 2.0 were formed by photoresist patterning with a resist 72. Thereafter, as shown in FIG. 3A, copper as an interconnect material was embedded selectively in the trenches 72a in a bottom-up manner by electroless plating utilizing the barrier layer (COWB alloy layer) 70 as a catalyst, thereby forming first-level interconnects (lower-level interconnects) 48 of copper. Thereafter, as shown in FIG. 3B, unnecessary resist 72 was removed. Further, as shown in FIG. 3C, extra portions of the barrier layer (CoWB alloy layer) 70 and extra portions of the liner layer (Co layer) 50 were removed by wet etching utilizing the lower-level interconnects 48 as a mask. The lower-level interconnects 48 were then heat-treated (annealed) in an $N_2+H_2$ atmosphere at 400° C. for 30 minute for lowering of resistivity and enhancement, by stress reduction, of stress migration resistance and electromigration resistance of the lower-level interconnects 48.

Next, as shown in FIG. 4A, a barrier layer 74 of a COWB alloy was formed selectively on entire exposed surfaces of the lower-level interconnects 48 by electroless plating utilizing the lower-level interconnects 48 as a catalyst. Thereafter, as shown in FIG. 4B, a low-k material of a coating type was coated onto a surface of the insulating film 43, followed by heating to cure the material to form a first interlevel dielectric layer 44. Thereafter, as shown in FIG. 4C, the first interlevel dielectric layer 44 was polished and flattened by CMP to make a surface flush with an upper surface of the barrier layer 74 covering the lower-level interconnects 48.

Next, as shown in FIG. 5A, openings (via holes) 76a e.g. having a width of 50 nm, a depth of 100 nm and an AR (aspect ratio) of 2.0 were formed by photoresist patterning with a resist 76. Thereafter, as shown in FIG. 5B copper as a via metal was embedded selectively in the via holes 76a in a bottom-up manner by electroless plating utilizing the barrier layer (COWB alloy layer) 46 (74) at bottoms of the via holes as a catalyst, thereby forming via plugs 56. Thereafter, as shown in FIG. 5C, unnecessary resist 76 was removed. The via plugs 56 were then heat-treated (annealed) in an $N_2+H_2$ atmosphere at 400° C. for 30 minutes for lowering of resistivity and enhancement, by stress reduction, of stress migration resistance and electromigration resistance of the via plugs 56.

Next, as shown in FIG. 6A, a barrier layer 78 of a COWB alloy was formed selectively on entire exposed surfaces of the via plugs 56 by electroless plating utilizing the via plugs 56 as a catalyst. Thereafter, as shown in FIG. 6B, a low-k material of a coating type was coated on a surface of the first interlevel dielectric layer 44, followed by heating to cure the material to form a second interlevel dielectric layer 52. Thereafter, as shown in FIG. 6C, a surface of the second interlevel dielectric layer 52 was polished and flattened by CMP including etching back of the barrier layer 78 covering upper surfaces of the via plugs 56.

Thereafter, as shown in FIG. 7A, a 5 nm-thick liner layer 66 of Co was formed by sputtering on exposed surfaces of the second interlevel dielectric layer 52 and the via plugs 56 after CMP. Further, as shown in FIG. 7B, a 20 nm-thick barrier layer 80 of a COWB alloy was formed on the liner layer (Co layer) 66 by electroless plating utilizing the liner layer 66 as a catalyst. Thereafter, as shown in FIG. 8A, openings (trenches) 82a e.g. having a width of 80 nm, a depth of 160 nm and an AR (aspect ratio) of 2.0 were formed by photoresist patterning with a resist 82. Thereafter, as shown in FIG. 8B, copper as an interconnect material was embedded selectively in the trenches 82a in a bottom-up manner by electroless plating utilizing the barrier layer (COWB alloy layer) 80 as a catalyst, thereby forming second-level interconnects (upper-level interconnects) 64 of copper.

Thereafter, as shown in FIG. 9A, unnecessary resist 82 on the barrier layer 80 was removed. Further, as shown in FIG. 9B, extra portions of the barrier layer 80 and extra portions of the liner layer 66 on the second interlevel dielectric layer 52 were removed by wet etching utilizing the upper-level interconnects 64 as a mask. The upper-level interconnects 64 were then heat-treated (annealed) in an $N_2+H_2$ atmosphere at 400° C. for 30 minutes for lowering of resistivity and enhancement, by stress reduction, of stress migration resistance and electromigration resistance of the upper-level interconnects 64.

Thereafter, as shown in FIG. 10, a barrier layer 84 of a COWB alloy was formed selectively on entire exposed surfaces of the upper-level interconnects 64 by electroless plating utilizing the upper-level interconnects 64 as a catalyst.

As described hereinabove, the present invention can provide a semiconductor device having a multi-level interconnect structure which is highly reliable and which, owing to selective formation of a barrier layer only around interconnects and via plugs, has a low effective dielectric constant, easily with a high throughput and via a relatively inexpensive process. Further, the present invention enables selective embedding by selective bottom-up plating. Accordingly, unlike embedding plating in a dual damascene process, highly reliable void-less multi-level interconnects can be formed.

Furthermore, unlike annealing of embedded plating interconnects in a dual damascene process, interconnects or via plugs can be annealed when they are in an unconstrained or open state according to the present invention. This makes it possible to reduce stress in interconnects or via plugs with ease, thereby enhancing stress migration resistance and electromigration resistance.

What is claimed is:

1. A semiconductor device comprising:
   a lower-level interconnect embedded in an insulating film and surrounded by a barrier layer;
   a first liner layer on which is formed said barrier layer surrounding said lower-level interconnect;
   an upper-level interconnect embedded in an insulating film and surrounded by a barrier layer;
   a second liner layer on which is formed said barrier layer surrounding said upper-level interconnect; and
   a via plug embedded in an insulating film and surrounded by a barrier layer, said via plug electrically connecting said lower-level interconnect and said upper-level interconnect,
   wherein said upper-level interconnect is separated from said via plug by said barrier layer surrounding said upper-level interconnect.

2. The semiconductor device according to claim 1, wherein said lower-level interconnect is composed of Cu, a Cu alloy, Ag, an Ag alloy, Au or an Au alloy,
   said upper-level interconnect is composed of Cu, a Cu alloy, Ag, an Ag alloy, Au or an Au alloy, and
   said via plug is composed of Cu, a Cu alloy, Ag, an Ag alloy, Au or an Au alloy.

3. The semiconductor device according to claim 2, wherein
said barrier layer surrounding said lower-level interconnect is composed of Co, a Co alloy, Ni, a Ni alloy, Ti, a Ti alloy, Ta, a Ta alloy, or a nitride thereof,
said barrier layer surrounding said upper-level interconnect is composed of Co, a Co alloy, Ni, a Ni alloy, Ti, a Ti alloy, Ta, a Ta alloy, or a nitride thereof, and
said barrier layer surrounding said via plug is composed of Co, a Co alloy, Ni, a Ni alloy, Ti, a Ti alloy, Ta, a Ta alloy, or a nitride thereof.

4. The semiconductor device according to claim 3, wherein
said first liner layer is composed of at least one of Pd, Ag, Au, Pt, Co, Ni and Sn, or an alloy thereof, and
said second liner layer is composed of at least one of Pd, Ag, Au, Pt, Co, Ni and Sn, or an alloy thereof.

5. The semiconductor device according to claims 1, wherein
said first liner layer is composed of at least one of Pd, Ag, Au, Pt, Co, Ni and Sn, or an alloy thereof, and
said second liner layer is composed of at least one of Pd, Ag, Au, Pt, Co, Ni and Sn, or an alloy thereof.

6. The semiconductor device according to claim 1, wherein
said barrier layer surrounding said lower-level interconnect is composed of Co, a Co alloy, Ni, a Ni alloy, Ti, a Ti alloy, Ta, a Ta alloy, or a nitride thereof,
said barrier layer surrounding said upper-level interconnect is composed of Co, a Co alloy, Ni, a Ni alloy, Ti, a Ti alloy, Ta, a Ta alloy, or a nitride thereof, and
said barrier layer surrounding said via plug is composed of Co, a Co alloy, Ni, a Ni alloy, Ti, a Ti alloy, Ta, a Ta alloy, or a nitride thereof.

7. A method for manufacturing a semiconductor device, comprising:
forming a lower-level interconnect, surrounded by a first barrier layer, on an insulating film such that said lower-level interconnect extends beyond a surface of said insulating film, by
(i) forming a first liner layer on said surface of said insulating film,
(ii) applying to a surface of said first liner layer, material that is to form a portion of said first barrier layer,
(iii) using a first resist to form a first interconnect pattern on a surface of said material that is to form said portion of said first barrier layer,
(iv) embedding a first interconnect material in said first interconnect pattern to form a first interconnect composed of said first interconnect material,
(v) removing said first resist from said material that is to form said portion of said first barrier layer, removing an unnecessary portion of said material that is to form said portion of said first barrier layer, and removing an unnecessary portion of said first liner layer, and
(vi) forming a remaining portion of said first barrier layer on all exposed surfaces of said first interconnect;
forming a first interlevel dielectric layer on said surface of said insulating film such that a surface of said first barrier layer is exposed;
forming a via plug, surrounded by a second barrier layer, on said surface of said first barrier layer such that said via plug extends beyond a surface of said first interlevel dielectric layer and is electrically connected to said lower-level interconnect;
forming a second interlevel dielectric layer on said surface of said first interlevel dielectric layer and said surface of said first barrier layer such that a surface of said via plug is exposed; and
forming an upper-level interconnect, surrounded by a third barrier layer, on said second interlevel dielectric layer such that said upper-level interconnect extends beyond a surface of said second interlevel dielectric layer and is electrically connected to said via plug, by
(i) forming a second liner layer on said surface of said second interlevel dielectric layer,
(ii) applying to a surface of said second liner layer, material that is to form a portion of said third barrier layer,
(iii) using a second resist to form a second interconnect pattern on a surface of said material that is to form said portion of said third barrier layer,
(iv) embedding a second interconnect material in said second interconnect pattern to form a second interconnect composed of said second interconnect material,
(v) removing said second resist from said material that is to form said portion of said third barrier layer, removing an unnecessary portion of said material that is to form said
portion of said third barrier layer, and removing an unnecessary portion of said second liner layer, and
(vi) forming a remaining portion of said third barrier layer on all exposed surfaces of said second interconnect.

8. The method according to claim 7, further comprising:
polishing said first interconnect material, after embedding said first interconnect material in said first interconnect pattern, to remove unnecessary first interconnect material and flatten a surface of said first interconnect; and
polishing said second interconnect material, after embedding said second interconnect material in said second interconnect pattern, to remove unnecessary second interconnect material and flatten a surface of said second interconnect.

9. The method according to claim 8, wherein
polishing said first interconnect material comprises chemical mechanical polishing said first interconnect material, and
polishing said second interconnect material comprises chemical mechanical polishing said second interconnect material.

10. The method according to claim 7, further comprising:
heat treating said first interconnect after removing said first resist, said unnecessary portion of said material that is to form said portion of said first barrier layer, and said unnecessary portion of said first liner layer; and
heat treating said second interconnect after removing said second resist, said unnecessary portion of said material that is to form said portion of said third barrier layer, and said unnecessary portion of said second liner layer.

11. The method according to claim 7, wherein
forming a first liner layer comprises forming a liner layer composed of at least one of Pd, Ag, Au, Pt, Co, Ni and Sn, or an alloy thereof, and
forming a second liner layer comprises forming a liner layer composed of at least one of Pd, Ag, Au, Pt, Co, Ni and Sn, or an alloy thereof.

12. The method according to claim 7, wherein
embedding said first interconnect material in said first interconnect pattern comprises performing electrolytic plating or electroless plating to embed said first interconnect material in a bottom-up manner, and
embedding said second interconnect material in said second interconnect pattern comprises performing electrolytic plating or electroless plating to embed said second interconnect material in a bottom-up manner.

13. The method according to claim 7, wherein
removing said unnecessary portion of said material that is to form said portion of said first barrier layer comprises removing said unnecessary portion by performing selective etching utilizing said first interconnect as a mask,
removing said unnecessary portion of said first liner layer comprises removing said unnecessary portion by performing selective etching utilizing said first interconnect as a mask,
removing said unnecessary portion of said material that is to form said portion of said third barrier layer comprises removing said unnecessary portion by performing selective etching utilizing said second interconnect as a mask, and
removing said unnecessary portion of said second liner layer comprises removing said unnecessary portion by performing selective etching utilizing said second interconnect as a mask.

14. The method according to claim 7, wherein
forming said remaining portion of said first barrier layer on all exposed surfaces of said first interconnect comprises forming said remaining portion by performing electroless plating, and
forming said remaining portion of said third barrier layer on all exposed surfaces of said second interconnect comprises forming said remaining portion by performing electroless plating.

15. A method for manufacturing a semiconductor device, comprising:
forming a lower-level interconnect, surrounded by a first barrier layer, on an insulating film such that said lower-level interconnect extends beyond a surface of said insulating film;
forming a first interlevel dielectric layer on said surface of said insulating film such that a surface of said first barrier layer is exposed;
forming a via plug, surrounded by a second barrier layer, on said surface of said first barrier layer such that said via plug extends beyond a surface of said first interlevel dielectric layer and is electrically connected to said lower-level interconnect, by
  (i) using a resist to form a via pattern on said surface of said first interlevel dielectric layer and said surface of said first barrier layer,
  (ii) embedding a metal in said via pattern so as to form a metal via plug composed of said metal,
  (iii) removing said resist from said first interlevel dielectric layer and said first barrier layer,
  (iv) heat treating said metal via plug, and
  (v) forming said second barrier layer on an exposed surface of said metal via plug;
forming a second interlevel dielectric layer on said surface of said first interlevel dielectric layer and said surface of said first barrier layer such that a surface of said via plug is exposed; and
forming an upper-level interconnect, surrounded by a third barrier layer, on a surface of said second interlevel dielectric layer such that said upper-level interconnect extends beyond said surface of said second interlevel dielectric layer and is electrically connected to said via plug.

16. The method according to claim 15, wherein embedding said metal in said via pattern comprises performing electroless plating to embed said metal in a bottom-up manner.

17. The method according to claim 15, wherein forming said second barrier layer on an exposed surface of said metal via plug comprises forming said second barrier layer by performing electroless plating.

* * * * *